(12) United States Patent
Takamura

(10) Patent No.: US 10,297,439 B2
(45) Date of Patent: May 21, 2019

(54) FILM FORMING METHOD AND FILM FORMING SYSTEM

(71) Applicant: Tokyo Electron Limited, Tokyo (JP)

(72) Inventor: Yuya Takamura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/437,594

(22) Filed: Feb. 21, 2017

(65) Prior Publication Data
US 2017/0250072 A1    Aug. 31, 2017

(30) Foreign Application Priority Data

Feb. 25, 2016  (JP) ................................. 2016-034591
Oct. 24, 2016  (JP) ................................. 2016-208128

(51) Int. Cl.
| | | |
|---|---|---|
| *H01L 21/02* | (2006.01) | |
| *C23C 16/52* | (2006.01) | |
| *C23C 16/34* | (2006.01) | |
| *C23C 16/455* | (2006.01) | |

(52) U.S. Cl.
CPC ........ *H01L 21/0217* (2013.01); *C23C 16/345* (2013.01); *C23C 16/45523* (2013.01); *C23C 16/45574* (2013.01); *C23C 16/45578* (2013.01); *C23C 16/52* (2013.01); *H01L 21/0228* (2013.01); *H01L 21/02211* (2013.01)

(58) Field of Classification Search
CPC ..................... H01L 21/02271; H01L 21/0217
See application file for complete search history.

(56) References Cited

U.S. PATENT DOCUMENTS

2012/0100722 A1*  4/2012  Asai ........................ C23C 16/08
                                                              438/758
2013/0252435 A1*  9/2013  Shimamoto ....... H01L 21/02263
                                                              438/758

FOREIGN PATENT DOCUMENTS

| JP | 2014-007378 A | | 1/2014 | | |
| JP | 2014007378 A | * | 1/2014 | ....... | H01L 21/02271 |

* cited by examiner

*Primary Examiner* — Kyoung Lee
*Assistant Examiner* — Christina A Sylvia
(74) *Attorney, Agent, or Firm* — Abelman, Frayne & Schwab

(57) ABSTRACT

A film forming method of depositing a thin film of a reaction product generated by a reaction between a raw material gas and a reactive gas on a substrate by alternately supplying the raw material gas and the reactive gas to the substrate accommodated in a processing container. The film forming method includes: storing the raw material gas in a reservoir; adsorbing the raw material gas on the substrate by supplying the raw material gas stored in the reservoir to the substrate; and reacting the raw material gas and the reactive gas with each other by supplying the reactive gas to the substrate on which the raw material gas is adsorbed to generate the reaction product; wherein the storing, the adsorbing, and the reacting are repeated a plurality of times, while a condition for the storing is changed at least once.

11 Claims, 6 Drawing Sheets

FILM FORMING METHOD AND FILM FORMING SYSTEM

CROSS-REFERENCE TO RELATED APPLICATIONS

This application is based on and claims priority from Japanese Patent Application Nos. 2016-034591 and 2016-208128, filed on Feb. 25, 2016 and Oct. 24, 2016, with the Japan Patent Office, the disclosures of which are incorporated herein in their entireties by reference.

TECHNICAL FIELD

The present disclosure relates to a film forming method and a film forming system.

BACKGROUND

Conventionally, there has been known a method of alternately supplying a raw material gas and a reactive gas to a substrate such as, for example, a semiconductor wafer, thereby depositing a thin film of a reaction product generated by a reaction between the raw material gas and the reactive gas on the substrate.

There has also been known a method of generating a mixed gas by mixing a raw material gas and a purge gas in a buffer tank, supplying the mixed gas and a reactive gas into a processing container, thereby depositing a thin film on a substrate (see, e.g., Japanese Patent Laid-Open Publication No. 2014-007378). In this method, the in-plane uniformity of a film thickness is improved in a state where the film forming rate is kept high.

SUMMARY

The present disclosure provides a film forming method of depositing a thin film of a reaction product generated by a reaction between a raw material gas and a reactive gas on a substrate by alternately supplying the raw material gas and the reactive gas to the substrate accommodated in a processing container. The film forming method including: storing the raw material gas in a reservoir; adsorbing the raw material gas on the substrate by supplying the raw material gas stored in the reservoir to the substrate; and reacting the raw material gas and the reactive gas with each other by supplying the reactive gas to the substrate on which the raw material gas is adsorbed to generate the reaction product. The storing, the adsorbing, and the reacting are repeated a plurality of times, while a condition for the storing is changed at least once The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
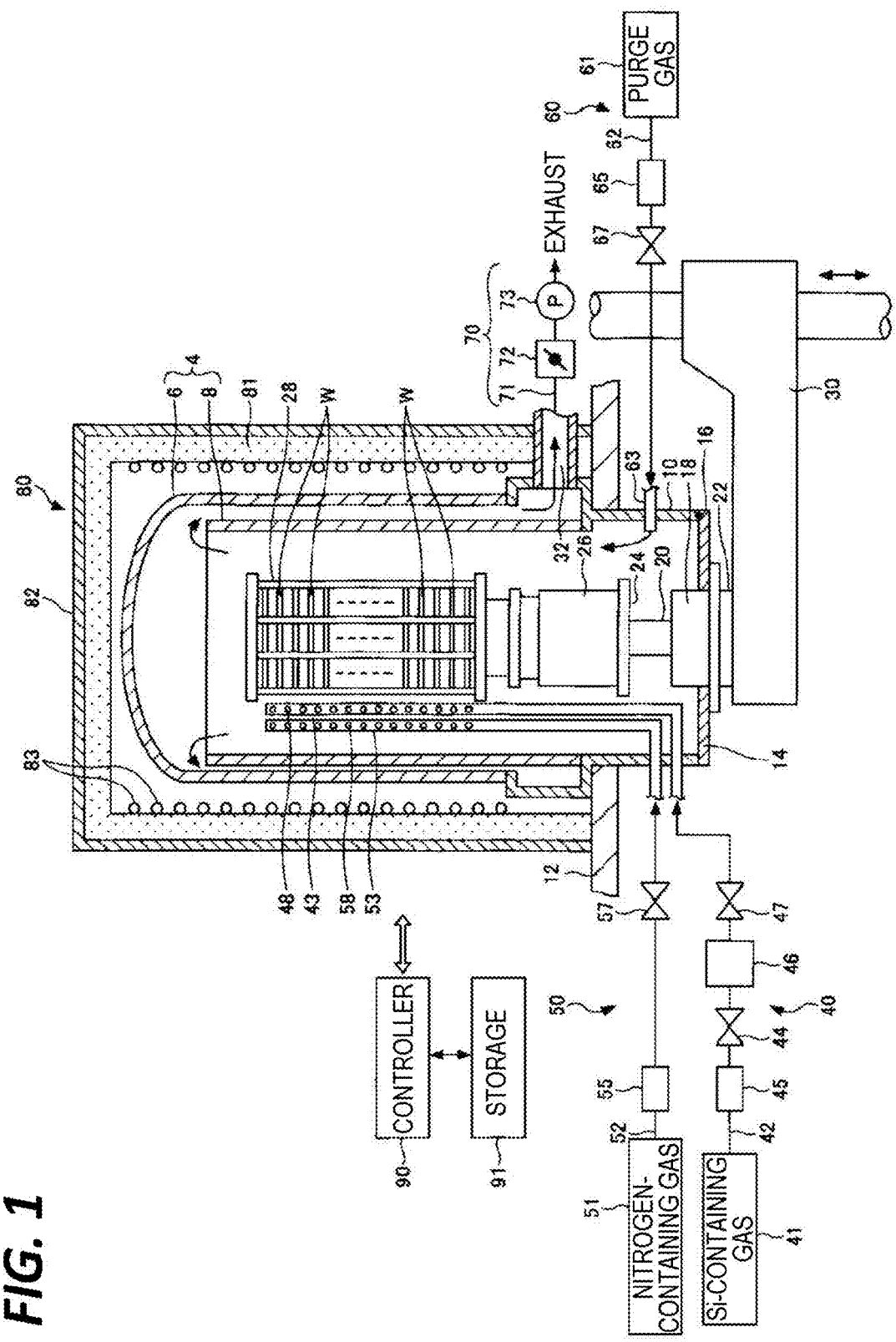
FIG. 1 is a schematic configuration view illustrating an example of a film forming apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

When a thin film is deposited on a substrate, it is not necessarily preferable that the in-plane uniformity of a film thickness is excellent. It may be preferable to deposit a thin film having a desired film thickness distribution.

Thus, a film forming method capable of depositing a thin film with a desired film thickness distribution is required.

In order to achieve the above described object, according to an aspect of the present disclosure, there is provided a film forming method of depositing a thin film of a reaction product generated by a reaction between a raw material gas and a reactive gas on a substrate by alternately supplying the raw material gas and the reactive gas to the substrate accommodated in a processing container. The film forming method includes: storing the raw material gas in a reservoir; adsorbing the raw material gas on the substrate by supplying the raw material gas stored in the reservoir to the substrate; and reacting the raw material gas and the reactive gas with each other by supplying the reactive gas to the substrate on which the raw material gas is adsorbed to generate the reaction product. The storing, the adsorbing, and the reacting are repeated a plurality of times, while a condition for the storing is changed at least once.

In the above described film forming method, the reservoir is provided in a pipe that connects a supply source of the raw material gas to the processing container.

In the above described film forming method, the storing of the raw material gas includes a first storage step and a second storage step which are different in a condition under which the raw material gas is stored in the reservoir, and the first storage step and the second storage step are alternately repeated whenever the storing, the adsorbing, and the reacting are repeated In the above described film forming method, the first storage step and the second storage step are different in a time during which the raw material gas is stored in the reservoir.

In the above described film forming method, the first storage step and the second storage step are different in a flow rate of the raw material gas when the raw material gas is stored in the reservoir from the supply source of the raw material gas.

In the above described film forming method, the storing of the raw material gas is performed in a period during which the reacting is performed.

The above described film forming method further includes supplying a purge gas into the processing container between the adsorbing and the reacting.

In the above described film forming method, in the adsorbing, the raw material gas is supplied to the substrate while the substrate is rotated.

In the above described film forming method, in the adsorbing, the raw material gas is supplied in a direction parallel to a surface of the substrate.

In the above described film forming method, the raw material gas is a silicon-containing gas.

In the above described film forming method, the reactive gas is a nitrogen-containing gas.

According to another aspect of the present disclosure, there is provided a film forming system of depositing a thin film of a reaction product generated by a reaction of a raw material gas and a reactive gas on a substrate by alternately supplying the raw material gas and the reactive gas to the substrate. The film forming system includes: a raw material gas supply unit configured to store the raw material gas in a reservoir, and supply the raw material gas stored in the reservoir to the substrate; a reactive gas supply unit configured to supply the reactive gas to the substrate; and a controller configured to control the raw material gas supply unit and the reactive gas supply unit to repeat the supplying of the raw material gas, and the supplying of the reactive gas a plurality of times, and change, at least once, a condition under which the raw material gas is stored in the reservoir during the supplying of the raw material gas while the supplying of the raw material gas, and the supplying of the reactive gas are repeated the plurality of times.

According to the disclosed film forming method, a thin film with a desired film thickness distribution may be deposited.

Hereinafter, exemplary embodiments of the present disclosure will be described with reference to drawings. Meanwhile, in the present specification and drawings, components which are substantially the same will be denoted by the same symbols, and the descriptions thereof will be omitted.

(Film Forming Apparatus)

An example of a film forming apparatus according to the present exemplary embodiment will be described with reference to FIG. 1. FIG. 1 is a schematic configuration view illustrating an example of a film forming apparatus according to the present exemplary embodiment.

As illustrated in FIG. 1, the film forming apparatus includes a substantially cylindrical processing container 4 of which the longitudinal direction is a vertical direction. The processing container 4 has a double-tube structure that includes an outer tube 6 with a ceiling and a cylindrical inner tube 8 concentrically disposed inside the outer tube 6. The outer tube 6 and the inner tube 8 are made of a heat-resistant material such as quartz. The lower end portions of the outer tube 6 and the inner tube 8 are held by a manifold 10 made of, for example, stainless steel. The manifold 10 is fixed to a base plate 12. Meanwhile, the manifold 10 is formed of a separate member from the outer tube 6 and the inner tube 8, but is structurally formed integrally with the outer tube 6 and the inner tube 8, and forms a substantially cylindrical inner space together with the outer tube 6 and the inner tube 8. Thus, it is assumed that the manifold 10 forms a part of the processing container 4. That is, the processing container 4 includes the outer tube 6 and the inner tube 8 made of a heat-resistant material such as, for example, quartz, and the manifold 10 made of, for example, stainless steel, and the manifold 10 is provided under the side surface of the processing container 4 to hold the outer tube 6 and the inner tube 8 from the lower side.

A disk-shaped lid 14 made of, for example, stainless steel is attached to the opening portion of the lower end portion of the manifold 10 so as to be hermetically sealable via a seal member 16 such as an O-ring. A rotating shaft 20 is inserted through a substantially central portion of the lid 14, and is rotatable while maintaining an airtight state by, for example, a magnetic fluid seal 18. A lower end of the rotating shaft 20 is connected to a rotating mechanism 22, and an upper end of the rotating shaft 20 is fixed to a table 24 made of, for example, stainless steel.

A heat insulating cylinder 26 made of, for example, quartz is provided on the table 24. A wafer boat 28 made of, for example, quartz, as a support, is placed on the heat insulating cylinder 26.

The wafer boat 28 is a substrate holding unit configured to hold wafers W within the processing container 4. In the wafer boat 28, a plurality of (e.g., 50 to 175) substrates such as, for example, wafers W are accommodated at predetermined intervals, for example, at pitches of about 10 mm. The wafer boat 28, the heat insulating cylinder 26, the table 24, and the lid 14 are integrally loaded into/unloaded from the processing container 4 by an elevating mechanism 30 serving as, for example, a boat elevator.

The film forming apparatus includes a Si-containing gas supply unit 40 configured to supply a silicon-containing gas (a Si-containing gas) into the processing container 4, a nitrogen-containing gas supply unit 50 configured to supply a nitrogen-containing gas into the processing container 4, and a purge gas supply unit 60 configured to supply a purge gas into the processing container 4. Meanwhile, the Si-containing gas is an example of a raw material gas, and the nitrogen-containing gas is an example of a reactive gas. The Si-containing gas supply unit 40 is an example of a raw material gas supply unit, and the nitrogen-containing gas supply unit 50 is an example of a reactive gas supply unit.

The Si-containing gas supply unit 40 includes a Si-containing gas supply source 41, a Si-containing gas pipe 42, and a Si-containing gas nozzle 43.

The Si-containing gas pipe 42 is connected to the Si-containing gas supply source 41 and the Si-containing gas nozzle 43 to guide a Si-containing gas from the Si-containing gas supply source 41 to the Si-containing gas nozzle 43. The Si-containing gas pipe 42 is provided with an opening/closing valve 44, a flow rate controller 45, a reservoir (buffer tank) 46, and an opening closing valve 47. For example, when the opening/closing valve 44 is opened in a state where the opening closing valve 47 is closed, the Si-containing gas may flow from the Si-containing gas supply source 41 at a predetermined flow rate and may be stored (charged) in the reservoir 46. After the Si-containing gas is stored in the reservoir 46, the Si-containing gas in a predetermined amount may be supplied into the processing container 4 through the Si-containing gas nozzle 43 by closing the opening/closing valve 44 and opening the opening closing valve 47.

The Si-containing gas nozzle 43 is connected to the Si-containing gas pipe 42, and is bent upwardly and extends vertically while inwardly passing through the side wall of the manifold 10. The Si-containing gas nozzle 43 is formed of, for example, a quartz tube. A plurality of gas ejecting holes 48 are formed at predetermined intervals along the longitudinal direction on the vertical portion of the Si-containing gas nozzle 43, and are configured to substantially uniformly eject a Si-containing gas toward the inside of the processing container 4 in a horizontal direction from each of the gas ejecting holes 48. That is, the Si-containing gas may be supplied in a direction parallel to the surface of the wafer W. Meanwhile, the number of the Si-containing gas nozzles 43 is not limited to one, but two or more Si-containing gas nozzles 43 may be provided.

The nitrogen-containing gas supply unit 50 includes a nitrogen-containing gas supply source 51, a nitrogen-containing gas pipe 52, and a nitrogen-containing gas nozzle 53.

The nitrogen-containing gas pipe 52 is connected to the nitrogen-containing gas supply source 51 and the nitrogen-containing gas nozzle 53 to guide a nitrogen-containing gas from the nitrogen-containing gas supply source 51 to the nitrogen-containing gas nozzle 53. The nitrogen-containing gas pipe 52 is provided with a flow rate controller 55 and an opening/closing valve 57, which are controlling a flow rate of the nitrogen-containing gas. By these, the start/stop of the supply of the nitrogen-containing gas, and the flow rate are controlled.

The nitrogen-containing gas nozzle 53 is connected to the nitrogen-containing gas pipe 52, and is bent upwardly and extends vertically while inwardly passing through the side wall of the manifold 10. The nitrogen-containing gas nozzle 53 is formed of, for example, a quartz tube. A plurality of gas ejecting holes 58 are formed at predetermined intervals along the longitudinal direction on the vertical portion of the nitrogen-containing gas nozzle 53, and are configured to substantially uniformly eject the nitrogen-containing gas toward the processing container 4 in a horizontal direction from each of the gas ejecting holes 58. That is, the nitrogen-containing gas may be supplied in a direction parallel to the surface of the wafer W. Meanwhile, the number of the nitrogen-containing gas nozzles 53 is not limited to one, but two or more nitrogen-containing gas nozzles 53 may be provided.

The purge gas supply unit 60 includes a purge gas supply source 61, a purge gas pipe 62, and a purge gas nozzle 63.

The purge gas pipe 62 is connected to the purge gas supply source 61 and the purge gas nozzle 63 to guide a purge gas from the purge gas supply source 61 to the purge gas nozzle 63. The purge gas pipe 62 is provided with a flow rate controller 65 and an opening/closing valve 67 to control the flow rate of the purge gas. By the flow rate controller 65 and the opening/closing valve 67, the start/stop of the supply of the purge gas and the flow rate are controlled.

The purge gas nozzle 63 is a straight nozzle (a straight tube) that is connected to the purge gas pipe 62 and inwardly passes through the side wall of the manifold 10. The purge gas nozzle 63 is formed of, for example, a quartz tube.

A gas outlet 32 is formed at the top of the manifold 10, and an exhaust system 70 is connected to the gas outlet 32. The exhaust system 70 includes an exhaust passage 71 connected to the gas outlet 32, and includes a pressure regulating valve 72 and a vacuum pump 73 which are sequentially connected in the middle of the exhaust passage 71. By the exhaust system 70, the atmosphere within the processing container 4 may be exhausted while the pressure of the atmosphere is adjusted.

At the outer periphery side of the processing container 4, a heater device 80 configured to heat wafers W is provided to surround the processing container 4.

The heater device 80 includes a cylindrical heat insulating layer 81 having a ceiling surface. The heat insulating layer 81 is made of, for example, a mixture of alumina and amorphous silica with a low thermal conductivity and softness.

The heat insulating layer 81 is disposed such that the inner periphery thereof is spaced apart from the outer surface of the processing container 4 by a predetermined distance. A protective cover 82 made of, for example, stainless steel is attached to the outer periphery of the heat insulating layer 81 to cover the whole of the outer circumference of the heat insulating layer 81.

Heater elements 83 are arranged at the inner periphery side of the heat insulating layer 81 while spirally wound. At the inner periphery side of the heat insulating layer 81, the heater elements 83 are provided to be wound around the entire side surface in the axial direction.

The heater elements 83 are divided into a plurality of zones (e.g., four zones) in the axial direction. Temperature control may be independently performed for each zone based on a temperature detected by a thermocouple (not illustrated) provided in the heat insulating layer 81 in each zone.

The control of respective components of the film forming apparatus, e.g., the supply/stop of each gas by the opening/closing of the opening/closing valves 44, 47, 57, and 67, the gas flow rate control by the flow rate controllers 45, 55, and 65, and the temperature control of the heater device 80 are performed by a controller 90 such as, for example, a computer.

The controller 90 is connected to a storage 91 that stores control programs for realizing various processes executed by the film forming apparatus under the control of the controller 90, or various programs (or recipes) for causing respective components of the film forming apparatus to execute processings according to processing conditions. The programs include a program for causing the film forming apparatus to execute a film forming method to be described below. The various programs may be stored in a storage medium and then stored in the storage 91. The storage medium may be a hard disk or a semiconductor memory, or may be a portable medium such as a CD-ROM, a DVD, or a flash memory. The recipes may be properly transmitted from other devices to the storage 91 through, for example, a dedicated line.

(Film Forming Method)

Hereinafter, descriptions will be made on an example of a film forming method according to the present exemplary embodiment, which uses the above described film forming apparatus.

The film forming method according to the present exemplary embodiment alternately supplies a Si-containing gas and a nitrogen-containing gas to wafers W, thereby depositing a silicon nitride film (SiN film) generated by the reaction between the Si-containing gas and the nitrogen-containing gas on the wafers W. The SiN film is an example of a thin film of a reaction product.

In the film forming method according to the present exemplary embodiment, a storage step, an adsorption step, and a reaction step are repeated a plurality of times, and conditions for the storage step are changed at least once while the steps are repeated a plurality of times. Meanwhile, the storage step is a step of storing the Si-containing gas in the reservoir 46. The adsorption step is a step of adsorbing the Si-containing gas on the wafers W by supplying the Si-containing gas stored in the reservoir 46 to the wafers W. The reaction step is a step of supplying a nitrogen-containing gas to the wafers W on which the Si-containing gas is adsorbed so that the Si-containing gas and the nitrogen-containing gas are reacted with each other, thereby generating a SiN film.

Figure 2:
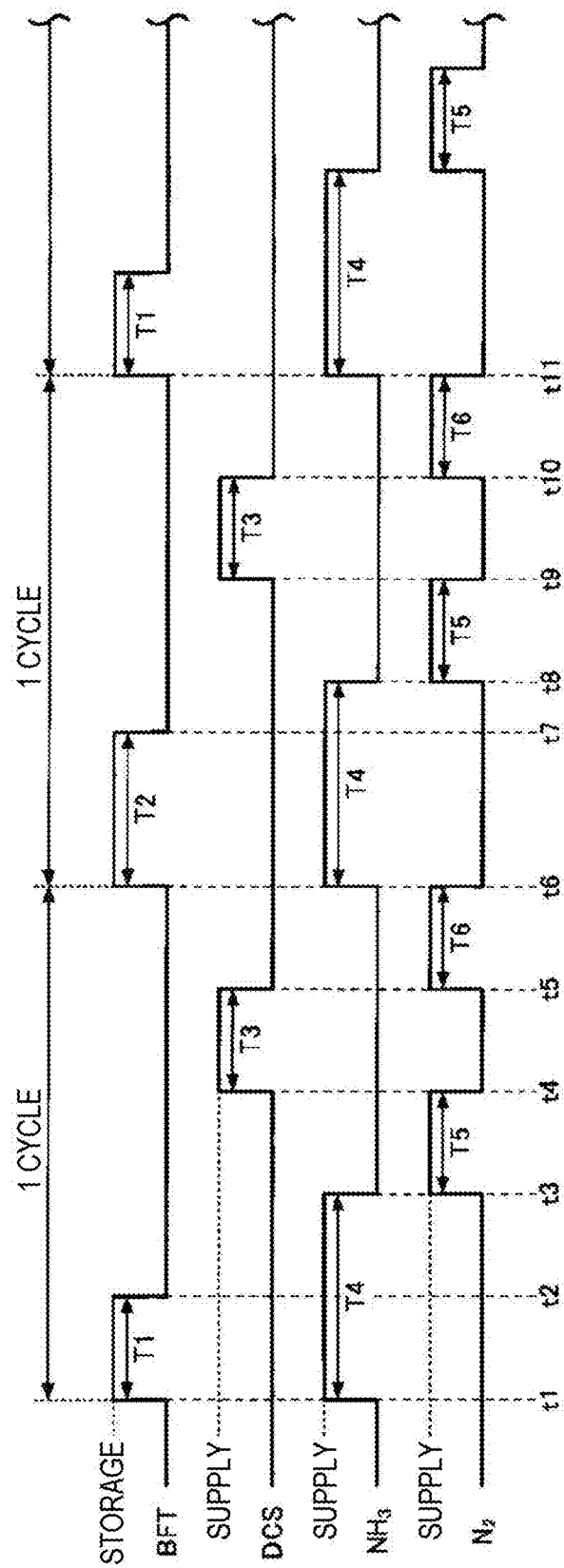
FIG. 2 is a timing chart illustrating an example of a film forming method according to the exemplary embodiment.

Hereinafter, descriptions will be made on a case where a SiN film is formed using dichlorosilane (DCS) gas as a Si-containing gas, ammonia ($NH_3$) gas as a nitrogen-containing gas, nitrogen ($N_2$) gas as a purge gas, as an example, with reference to FIG. 2. FIG. 2 is a timing chart illustrating an example of a film forming method according to the present exemplary embodiment. In FIG. 2, "BFT" represents an operation of the reservoir 46, "DCS" represents an operation of the Si-containing gas supply unit 40, "NH$_3$" represents an operation of the nitrogen-containing gas supply unit 50, and "N$_2$" represents an operation of the purge gas supply unit 60. Respective timings are represented by t1 to t11.

First, the wafer boat 28 in which a plurality of wafers W are placed is carried (loaded) into the processing container 4 controlled to a predetermined temperature while being raised from the lower side of the processing container 4. Then, the inside of the processing container 4 is hermetically sealed by closing the lower end opening of the manifold 10 by the lid 14. Then, the inside of the processing container 4 is evacuated and kept at a predetermined process pressure. The heater device 80 is powered ON to increase the temperature of the wafers W and maintain the process temperature. The rotating shaft 20 is rotated to rotate the wafers W (wafer boat 28).

Subsequently, a first storage step of storing a DCS gas in the reservoir 46 is performed. Specifically, as illustrated in FIG. 2, at timing t1, in a state where the opening closing valve 47 is closed, the opening/closing valve 44 is opened to start the storing of the DCS gas in the reservoir 46, in which the DCS gas is caused to flow from the Si-containing gas supply source 41 to the reservoir 46 at a predetermined flow rate controlled by the flow rate controller 45. Here, since the opening closing valve 47 is closed, the DCS gas is not supplied into the processing container 4. After a predetermined storage time T1 has elapsed, at timing t2, the opening/closing valve 44 is closed to stop the storing of the DCS gas in the reservoir 46 from the Si-containing gas supply source 41. The predetermined storage time T1 may be determined according to, for example, a volume of the processing container 4, a volume of the reservoir 46, a flow rate at which the DCS gas flows from the Si-containing gas supply source 41 to the reservoir 46, and a film thickness distribution of a film deposited on the wafers W.

A reaction step of supplying NH$_3$ gas to the wafers W is performed. Specifically, as illustrated in FIG. 2, at the same timing (timing t1) as the storage step, the opening/closing valve 57 is opened to start the supply of the NH$_3$ gas into the processing container 4, in which the NH$_3$ gas is caused to flow from the nitrogen-containing gas supply source 51 at a predetermined flow rate controlled by the flow rate controller 55. After a predetermined supply time T4 has elapsed, at timing t3, the opening/closing valve 57 is closed to stop the supply of the NH$_3$ gas into the processing container 4 from the nitrogen-containing gas supply source 51. The predetermined supply time T4 is not particularly limited as long as it is a time during which the DCS gas adsorbed on the wafers W in the adsorption step may be nitrided. Meanwhile, in the first cycle, since the adsorption step has not yet been carried out, a reaction product is not generated in this step. However, subsequently to the second cycle, a SiN film is generated in this step. Details on this point will be described later.

In FIG. 2, a mode in which the first storage step starts at the same timing (timing t1) as the reaction step has been described, but the present disclosure is not limited thereto. The first storage step only has to be performed prior to the adsorption step, and the first storage step and the reaction step may start at different timings. However, in view that a time of one cycle is shortened, the first storage step may be performed within a period of time during which the reaction step is performed.

Subsequently, a first purge step of supplying N$_2$ gas into the processing container 4 is performed. Specifically, as illustrated in FIG. 2, at timing t3, the opening/closing valve 67 is opened to start purging of the NH$_3$ gas within the processing container 4, in which the N$_2$ gas is caused to flow from the purge gas supply source 61 at a predetermined flow rate controlled by the flow rate controller 65. After a first purge time T5 has elapsed, at timing t4, the opening/closing valve 67 is closed to stop the supply of the N$_2$ gas into the processing container 4 from the purge gas supply source 61. The first purge time T5 may be determined according to, for example, a volume of the processing container 4, and may be set to range from, for example, 1 sec to 6 sec. Meanwhile, in FIG. 2, the first purge step starts at the same timing (timing t3) as a timing at which the supply of the NH$_3$ gas is stopped. However, the timing at which the first purge step starts is not limited thereto. For example, the first purge step may start after a predetermined time has elapsed after the supply of the NH$_3$ gas is stopped.

Subsequently, an adsorption step is performed in which the DCS gas stored in the reservoir 46 is supplied to the wafers W within the processing container 4 and is adsorbed on the wafers W. Specifically, as illustrated in FIG. 2, at timing t4, the opening/closing valve 44 is closed, and the opening closing valve 47 is opened such that the DCS gas stored in the reservoir 46 is supplied into the processing container 4. After a predetermined supply time T3 has elapsed, at timing t5, the opening closing valve 47 is closed to stop the supply of the DCS gas into the processing container 4 from the reservoir 46. The predetermined supply time T3 may be set as a time during which, for example, the total amount of the DCS gas stored in the reservoir 46 is supplied into the processing container 4. Meanwhile, in FIG. 2, the adsorption step starts at the same timing (timing t4) as a timing at which the supply of the N$_2$ gas is stopped. However, the timing at which the adsorption step starts is not limited thereto. For example, the adsorption step may start after a predetermined time has elapsed after the supply of the NH$_3$ gas is stopped.

Subsequently, a second purge step of supplying N$_2$ gas into the processing container 4 is performed. Specifically, as illustrated in FIG. 2, at timing t5, the opening/closing valve 67 is opened to start purging of DCS gas within the processing container 4 in which the N$_2$ gas is caused to flow from the purge gas supply source 61 at a predetermined flow rate controlled by the flow rate controller 65. After a second purge time T6 has elapsed, at timing t6, the opening/closing valve 67 is closed to stop the supply of the N$_2$ gas into the processing container 4 from the purge gas supply source 61. The second purge time T6 may be determined according to, for example, the volume of the processing container 4, and may be set to range from, for example, 1 sec to 6 sec. Meanwhile, in FIG. 2, the second purge step starts at the same timing (timing t5) as a timing at which the supply of the DCS gas is stopped. However, the timing at which the second purge step starts is not limited thereto. For example, the second purge step may start after a predetermined time has elapsed after the supply of the DCS gas is stopped.

Thus, the first cycle is completed.

Next, subsequently to the first cycle, the second cycle is performed. In the second cycle, the storage time of the DCS gas in the storage step is made longer than in the first cycle. Specifically, as illustrated in FIG. 2, the relationship between the storage time T1 in the storage step in the first cycle (the first storage step) and the storage time T2 in the storage step in the second cycle (the second storage step) is set to be T1<T2.

First, a second storage step of storing a DCS gas in the reservoir 46 is performed. Specifically, as illustrated in FIG. 2, at timing t6, in a state where the opening closing valve 47 is closed, the opening/closing valve 44 is opened to start the storing of the DCS gas in the reservoir 46, in which the DCS gas is caused to flow from the Si-containing gas supply source 41 at a predetermined flow rate controlled by the flow rate controller 45. Here, since the opening closing valve 47 is closed, the DCS gas is not supplied into the processing container 4. Then, after the storage time T2 longer than the storage time T1 in the first storage step has elapsed, at timing t7, the opening/closing valve 44 is closed to stop the storing of the DCS gas in the reservoir 46 from the Si-containing gas supply source 41. Meanwhile, in FIG. 2, the second storage step starts at the same timing (timing t6) as a timing at which the supply of the $N_2$ gas is stopped, but the timing at which the second storage step starts is not limited thereto. For example, the second storage step may start after a predetermined time has elapsed after the supply of the $N_2$ gas was stopped.

Also, a reaction step is performed in which a $NH_3$ gas is supplied to wafers W so that the DCS gas adsorbed on the wafers W in the adsorption step of the first cycle is reacted with the $NH_3$ gas to generate a SiN film. Specifically, as illustrated in FIG. 2, at the same timing (timing t6) as the storage step, the opening/closing valve 57 is opened to start the supply of the $NH_3$ gas into the processing container 4, in which the $NH_3$ gas is caused to flow from the nitrogen-containing gas supply source 51 at a predetermined flow rate. Accordingly, the DCS gas adsorbed on the wafers W in the adsorption step of the first cycle is reacted with the $NH_3$ gas to generate the SiN film. After a predetermined supply time T4 has elapsed, at timing t8, the opening/closing valve 57 is closed to stop the supply of the $NH_3$ gas into the processing container 4 from the nitrogen-containing gas supply source 51.

Meanwhile, in FIG. 2, a mode in which the second storage step starts at the same timing (timing t6) as the reaction step has been described, but the present disclosure is not limited thereto. The second storage step may be performed prior to the adsorption step, and the second storage step and the reaction step may start at different timings. However, in view of the fact that the time of one cycle is shortened, the second storage step may be performed within a period of time during which the reaction step is performed.

Subsequently, as in the first cycle, the first purge step, the adsorption step and the second purge step are performed in this order.

Specifically, as illustrated in FIG. 2, at timing t8, the opening/closing valve 67 is opened to start the purging of the $NH_3$ gas within the processing container 4, in which $N_2$ gas is caused to flow from the purge gas supply source 61 at a predetermined flow rate controlled by the flow rate controller 65. After a first purge time T5 has elapsed, at timing t9, the opening/closing valve 67 is closed to stop the supply of the $N_2$ gas into the processing container 4 from the purge gas supply source 61.

Subsequently, as illustrated in FIG. 2, at timing t9, the opening/closing valve 44 is closed, and the opening closing valve 47 is opened such that the DCS gas stored in the reservoir 46 is supplied into the processing container 4. After a predetermined supply time T3 has elapsed, at timing t10, the opening closing valve 47 is closed to stop the supply of the DCS gas into the processing container 4 from the reservoir 46.

Subsequently, as illustrated in FIG. 2, at timing t10, the opening/closing valve 67 is opened to start the purging of DCS gas within the processing container 4 in which the $N_2$ gas is caused to flow from the purge gas supply source 61 at a predetermined flow rate controlled by the flow rate controller 65. After a second purge time T6 has elapsed, at timing t11, the opening/closing valve 67 is closed to stop the supply of the $N_2$ gas into the processing container 4 from the purge gas supply source 61.

Thus, the second cycle is completed.

Subsequently, by alternately repeating the first cycle and the second cycle, a SiN film having a desired film thickness may be deposited. Meanwhile, when the first cycle and the second cycle are repeated alternately, since the DCS gas has not yet been adsorbed to the wafers W in the first cycle performed just after the wafers W were carried into the processing container 4, the reaction step may be omitted.

Figure 3A:
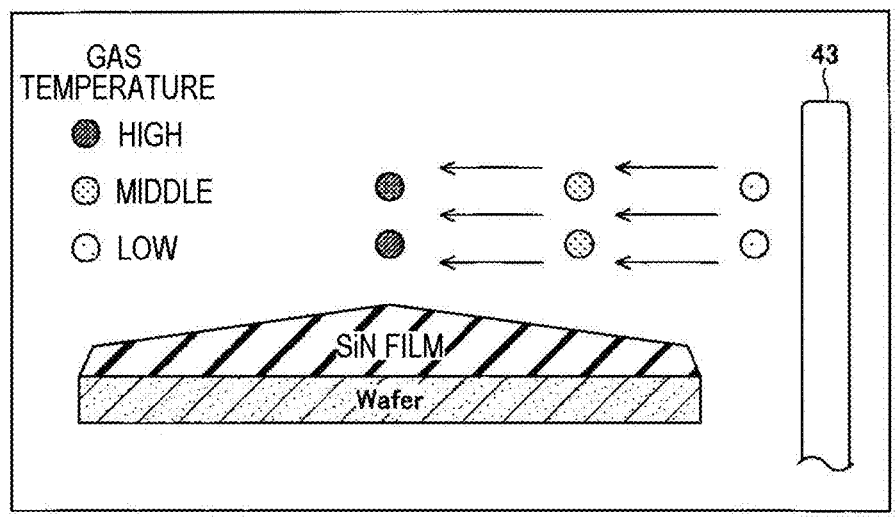
FIGS. 3A and 3B are views illustrating a relationship between a gas flow velocity and a film thickness distribution of a SiN film deposited on a wafer.
Figure 3B:
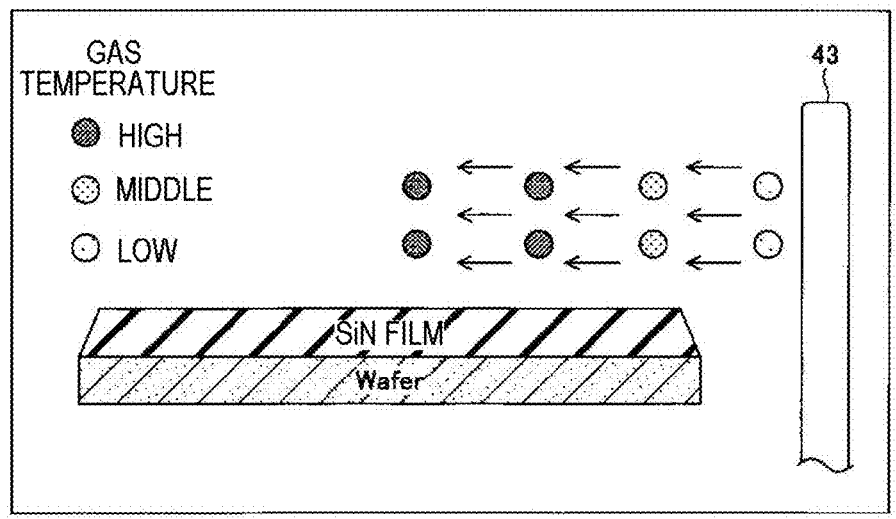

Next, descriptions will be made on a relationship between a gas flow velocity and a film thickness distribution of a SiN film deposited on the wafer W with reference to FIGS. 3A and 3B. FIGS. 3A and 3B are views illustrating a relationship between a gas flow velocity and a film thickness distribution of a SiN film deposited on the wafer, in which FIG. 3A illustrates a case where the gas flow velocity is fast, and FIG. 3B illustrates a case where the gas flow velocity is slow.

When the storage time of a DCS gas in the storage step is long, since the pressure of the reservoir 46 is increased, the flow velocity of the DCS gas supplied from the reservoir 46 into the processing container 4 is increased in the adsorption step. Thus, as illustrated in FIG. 3A, the warming of the DCS gas supplied from the Si-containing gas nozzle 43 is delayed so that the DCS gas may be more easily adsorbed on the central area of the wafer W than the outer peripheral area of the wafer W. As a result, the SiN film deposited on the wafer W has a distribution in which the film thickness increases from the outer peripheral area of the wafer W toward the central area.

In contrast, when the storage time in the storage step is short, since the pressure of the reservoir 46 is decreased, the flow velocity of the DCS gas supplied from the reservoir 46 into the processing container 4 is decreased in the adsorption step. Thus, as illustrated in FIG. 3B, the warming of the DCS gas supplied from the Si-containing gas nozzle 43 becomes fast so that the DCS gas may be more easily adsorbed on the central area and the outer peripheral area of the wafer W. As a result, the SiN film deposited on the wafer W has a substantially uniform film thickness distribution from the outer peripheral area to the central area of the wafer W.

In the present exemplary embodiment, as described above, the first cycle and the second cycle which are different from each other in the storage time of a DCS gas in a storage step are alternately repeated. Accordingly, it is possible to deposit a SiN film having a film thickness distribution that is a combination of a film thickness distribution of a SiN film obtained in the first cycle and a film thickness distribution of a SiN film obtained in the second cycle. By adjusting the storage time T1 of the storage step in the first cycle (first storage step) and the storage time T2 of the storage step in the second cycle (second storage step), it is possible to easily deposit a thin film having a desired film thickness distribution.

Meanwhile, in the present exemplary embodiment, a case where the storage time in the first storage step is different from that in the second storage step has been described, but the present disclosure is not limited thereto. The first storage step and the second storage step may be different in the pressure of the reservoir 46 when the DCS gas is stored in the reservoir 46. For example, when the DCS gas is stored in the reservoir 46 from the Si-containing gas supply source 41, the first and second storage steps may be different in the flow rate of the DCS gas. Also, the first and second storage steps may be different in both a storage time and a DCS gas flow rate.

Example

Figure 4A:
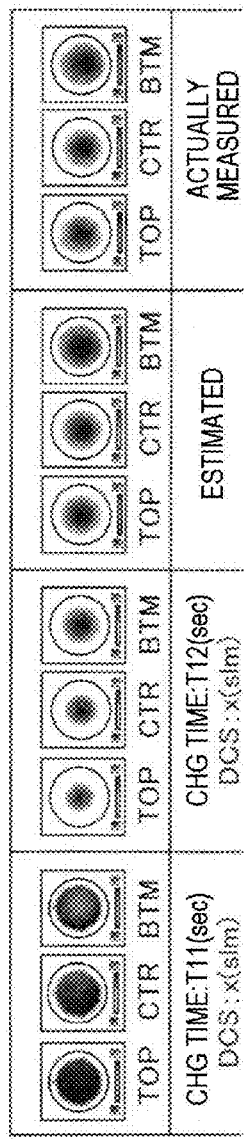
FIGS. 4A and 4B are views illustrating a characteristic of a SiN film when the SiN film is deposited on a wafer.
Figure 4B:
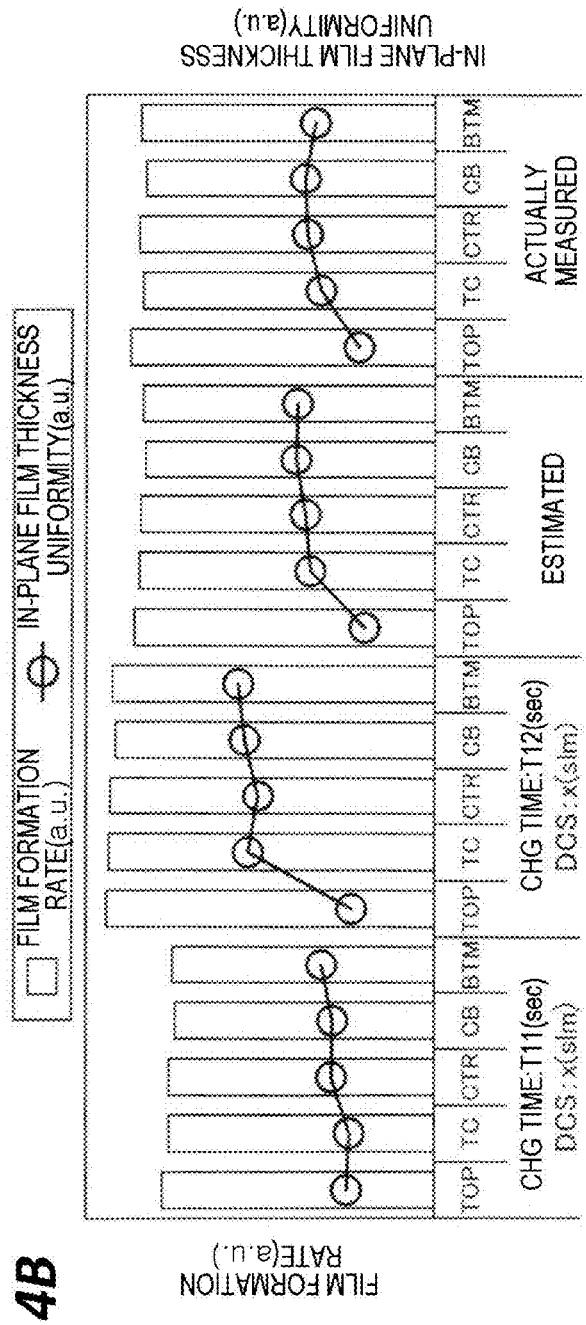

Next, a specific example of a film forming method will be described with reference to FIGS. 4A and 4B. FIGS. 4A and 4B are views illustrating a characteristic of a SiN film when the SiN film is deposited on a wafer, in which FIG. 4A illustrates an in-plane film thickness distribution of the wafer, and FIG. 4B illustrates a film formation rate per cycle and an in-plane film thickness uniformity. In FIG. 4B, the bar graph represents a film formation rate per cycle, and the broken line graph represents an in-plane film thickness uniformity.

In this example, by repeating a cycle including a storage step under any conditions, an adsorption step, and a reaction step a plurality of times, a SiN film is deposited on a wafer W. The wafer boat 28 holds a plurality of wafers W, and is divided into five zones in the vertical direction, that is, "TOP," "TC," "CTR," "CB," and "BTM" from top to bottom. In each zone, a characteristic of a SiN film was evaluated. FIG. 4A illustrates a film thickness distribution in "TOP," "CTR," and "BTM," and FIG. 4B illustrates a film formation rate per cycle, and an in-plane film thickness uniformity in "TOP," "TC," "CTR," "CB," and "BTM."

In FIGS. 4A and 4B, the leftmost diagram illustrates a characteristic of a SiN film when a flow rate of a DCS gas is x (slm), and a storage time (CHG) is T11 (sec) (a first storage condition). The second diagram from the left side illustrates a characteristic of a SiN film when a flow rate of a DCS gas is x (slm), and a storage time (CHG) is T12 (sec) (a second storage condition). Meanwhile, T11<T12. The third diagram from the left side illustrates a result of a simulation estimation on a characteristic of a SiN film when the storage step of the first storage condition and the storage step of the second storage condition are alternately repeated based on a characteristic of the SiN film when the first storage condition was used, and a characteristic of the SiN film when the second storage condition was used. The rightmost diagram illustrates a result of an actual measurement on a characteristic of a SiN film when the storage step of the first storage condition and the storage step of the second storage condition are alternately repeated.

As illustrated in FIGS. 4A and 4B, it can be found that the simulation calculation result (the third diagram from the left side) and the actual measurement result (the rightmost diagram) are substantially the same on a film thickness distribution, a film formation rate per cycle, and an in-plane film thickness uniformity of a SiN film when the storage step of the first storage condition and the storage step of the second storage condition are alternately repeated. That is, it is possible to estimate a characteristic of a SiN film obtained by alternately repeating storage steps having two different storage conditions. Accordingly, by alternately repeating storage steps having different storage conditions, it is possible to control a film thickness distribution, a film formation rate per cycle and an in-plane film thickness uniformity on a SiN film deposited on a wafer W.

Figure 5A:
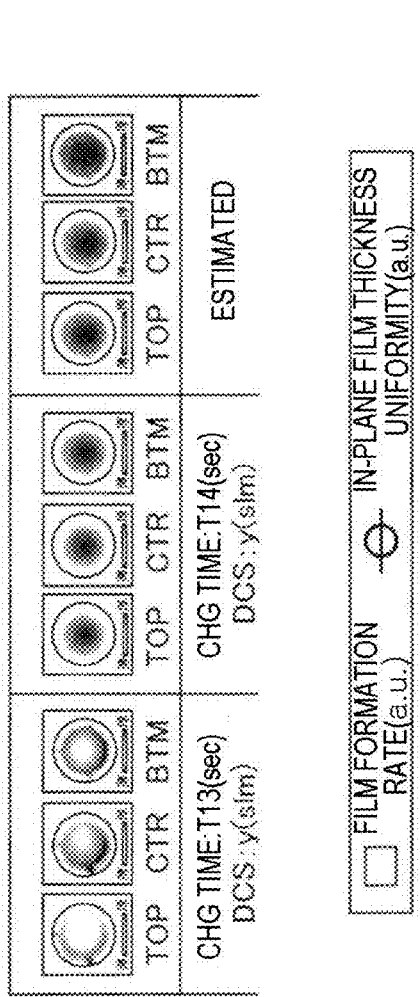
FIGS. 5A and 5B are views illustrating a characteristic of a SiN film when the SiN film is deposited on a wafer.
Figure 5B:
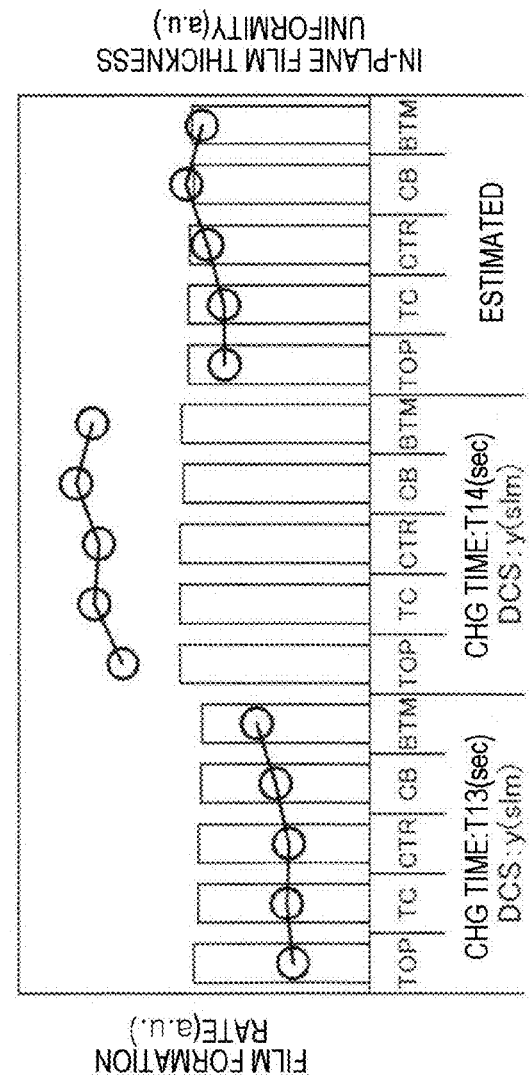

Next, another specific example of a film forming method will be described with reference to FIGS. 5A and 5B. FIGS. 5A and 5B are views illustrating a characteristic of a SiN film when the SiN film is deposited on a wafer, in which FIG. 5A illustrates an in-plane film thickness distribution of the wafer, and FIG. 5B illustrates a film formation rate per cycle and an in-plane film thickness uniformity. In FIG. 5B, the bar graph represents a film formation rate per cycle, and the broken line graph represents an in-plane film thickness uniformity.

In this example, by repeating a cycle including a storage step under any conditions, an adsorption step, and a reaction step, a plurality of times, a SiN film is deposited on a wafer W. The wafer boat 28 holds a plurality of wafers W, and is divided into five zones in the vertical direction, that is, "TOP," "TC," "CTR," "CB," and "BTM" from top to bottom. In each zone, a characteristic of a SiN film was evaluated. FIG. 5A illustrates a film thickness distribution in "TOP," "CTR," and "BTM," and FIG. 5B illustrates a film formation rate per cycle, and an in-plane film thickness uniformity in "TOP," "TC," "CTR," "CB," and "BTM."

In FIGS. 5A and 5B, the left diagram illustrates a characteristic of a SiN film when a flow rate of a DCS gas is y (slm), and a storage time (CHG) is T13 (sec) (a third storage condition). The central diagram illustrates a characteristic of a SiN film when a flow rate of a DCS gas is y (slm), and a storage time (CHG) is T14 (sec) (a fourth storage condition). Meanwhile, T13<T14. The right diagram illustrates a result of a simulation estimation on a characteristic of a SiN film when the storage step of the third storage condition and the storage step of the fourth storage condition are alternately repeated based on a characteristic of the SiN film when the third storage condition was used, and a characteristic of the SiN film when the fourth storage condition was used.

As illustrated in FIGS. 5A and 5B, it is possible to estimate, through simulation, a film thickness distribution, a film formation rate per cycle, and an in-plane film thickness uniformity of a SiN film when the storage step of the third storage condition and the storage step of the fourth storage condition are alternately repeated. Accordingly, by alternately repeating storage steps having different storage conditions, it is possible to control a film thickness distribution, a film formation rate per cycle and an in-plane film thickness uniformity on a SiN film deposited on a wafer W.

Figures 6A, 6B:
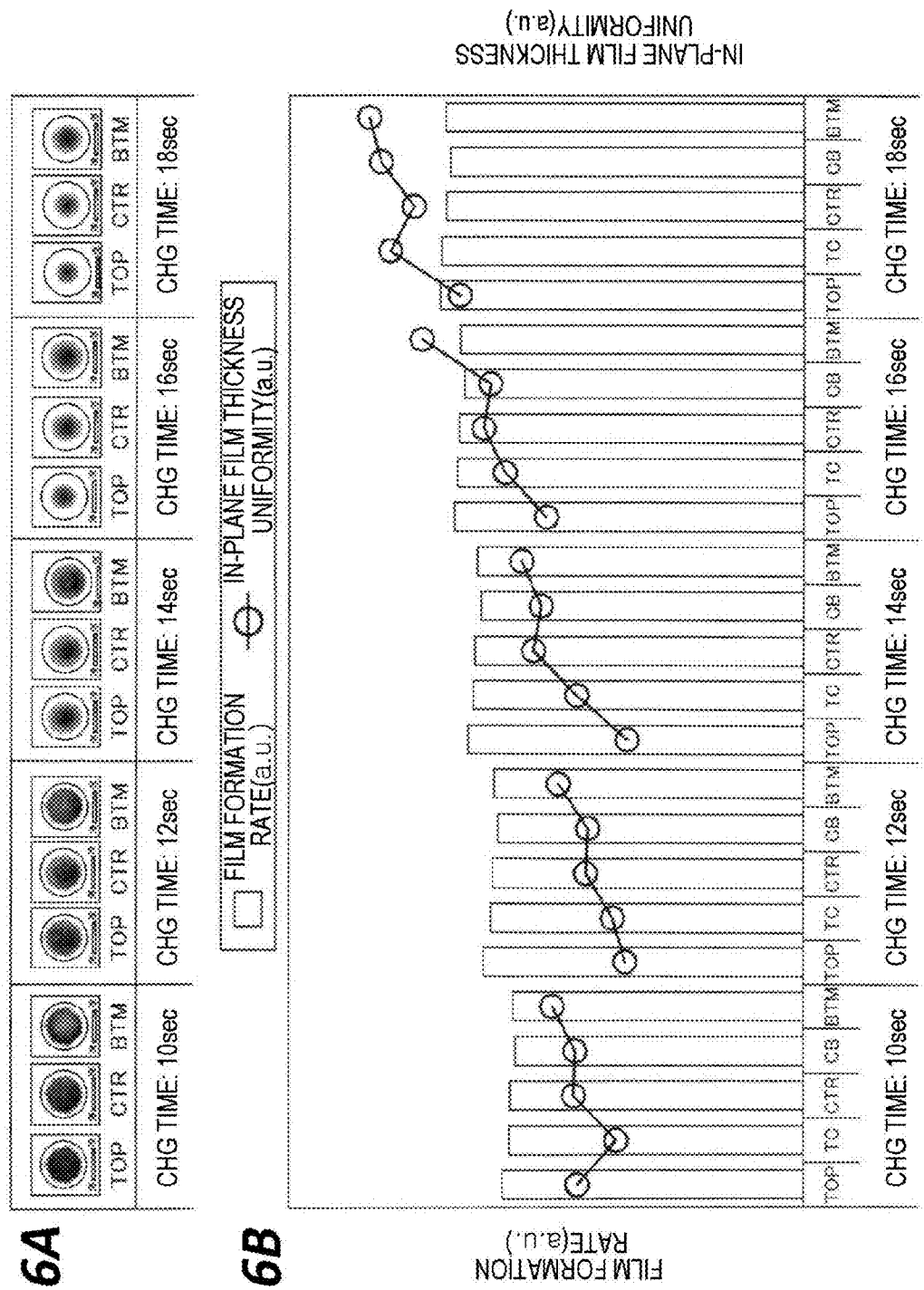
FIGS. 6A and 6B are views illustrating a change of a characteristic of a SiN when a storage time of a DCS gas is changed.

Next, descriptions will be made on a film thickness distribution, a film formation rate per cycle, and an in-plane film thickness uniformity of a SiN film when a storage time of a DCS gas is changed in the storage step, with reference to FIGS. 6A and 6B. FIGS. 6A and 6B are views illustrating a change of a characteristic of a SiN when a storage time of a DCS gas is changed, in which FIG. 6A illustrates an in-plane film thickness distribution of the wafer, and FIG. 6B illustrates a film formation rate per cycle and an in-plane film thickness uniformity. In FIG. 6B, the bar graph represents a film formation rate per cycle, and the broken line graph represents an in-plane film thickness uniformity.

In FIGS. 6A and 6B, results are illustrated in order from the left diagram when a storage time (CHG) of a DCS gas is set to 10 sec, 12 sec, 14 sec, 16 sec, and 18 sec.

As illustrated in FIG. 6A, it can be found that the longer the storage time of the DCS gas, the larger the difference between the central area and the outer peripheral area in a film thickness. As illustrated in FIG. 6B, it can be found that the longer the storage time of the DCS gas, the larger the values of a film formation rate per cycle and an in-plane film thickness uniformity. That is, by adjusting a storage time of a DCS gas, it is possible to control a film thickness distribution, a film formation rate per cycle and an in-plane film thickness uniformity on a SiN film deposited on a wafer W.

As described above, a film forming method has been described with reference to an exemplary embodiment, but the present disclosure is not limited to the exemplary embodiment, and various modification and improvements may be made within the scope of the present disclosure.

In the present exemplary embodiment, as a raw material gas, a DCS gas that is a Si-containing gas is used, but the present disclosure is not limited thereto. As the Si-containing gas, for example, at least one gas selected from the group including dichlorosilane (DCS), hexachlorodisilane (HCD), monosilane ($SiH_4$), disilane ($Si_2H_6$), hexamethyldisilazane (HMDS), tetrachlorosilane (TCS), disilylamine (DSA), trisilylamine (TSA), bis(tertiary-butylamino)silane (BTBAS), bisdiethylaminosilane (BDEAS), diisopropylaminosilane (DIPAS), and trisdimethylaminosilane (3DMAS) may be used.

As a reactive gas, $NH_3$ gas that is a nitrogen-containing gas is used, but the present disclosure is not limited thereto. As the nitrogen-containing gas, for example, dinitrogen monoxide ($N_2O$), or nitrogen monoxide (NO) may be used. As the reactive gas, instead of the nitrogen-containing gas, an oxygen-containing gas may be used.

In the present exemplary embodiment, a case where a SiN film is deposited using a Si-containing gas as a raw material gas, and a nitrogen-containing gas as a reactive gas has been described as an example, but the present disclosure is not limited thereto. A metal nitride film or a metal oxide film may be deposited using a metal compound gas containing a metal as a raw material gas. As the metal compound gas, for example, an organometallic compound gas may be used, and, for example, at least one gas selected from the group including trimethylaluminum (TMA), tetrakisdimethylamino hafnium (TDMAH), tetrakisethylmethylamino hafnium (TEMAH), tetrakisethylmethylamino zirconium (TEMAZ), and tetrakis (dimethylamino) titanium (TDMAT) may be used.

In the present exemplary embodiment, for example, a semiconductor wafer as a substrate has been described, but the semiconductor wafer includes a silicon substrate, and a compound semiconductor substrate such as GaAs, SiC, and GaN. Without being limited to these substrates, the present disclosure may be applied to, for example, a glass substrate or a ceramic substrate used in a liquid display device.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming method comprising:
   storing a silicon-containing gas serving as a raw material gas in a reservoir;
   supplying the silicon-containing gas stored in the reservoir to a substrate accommodated in a processing container such that the silicon-containing gas is adsorbed on the substrate;
   supplying a nitrogen-containing gas serving as a reactive gas to the substrate on which the silicon-containing gas is adsorbed in order to generate a silicon nitride product generated by a reaction between the silicon-containing gas and the nitrogen-containing gas; and
   repeating the storing of the silicon-containing gas, the supplying of the silicon-containing gas, and the supplying of the nitrogen-containing gas a plurality of times, while changing a storage condition for the storing of the silicon-containing gas at least once during the repeating, thereby depositing a thin film of the silicon nitride product on the substrate,
   wherein the storing the silicon-containing gas includes a first storage step of the storing the silicon-containing gas and a second storage step of the storing the silicon-containing gas each having a different period of time during which the raw material gas is stored in the reservoir, and
   the first storage step and the second storage step are alternately repeated whenever the storing the silicon-containing gas, the supplying the silicon-containing gas, and the supplying the nitrogen-containing gas are repeated.

2. The film forming method of claim 1, wherein the reservoir is provided in a pipe that connects a supply source of the raw material gas to the processing container.

3. The film forming method of claim 1, wherein the first storage step and the second storage step are different in a flow rate of the raw material gas when the raw material gas is stored in the reservoir from the supply source of the raw material gas.

4. The film forming method of claim 1, wherein the storing is performed in a period during which the reacting is performed.

5. The film forming method of claim 1, further comprising:
   supplying a purge gas into the processing container between the adsorbing and the reacting.

6. The film forming method of claim 1, wherein in the adsorbing of the raw material gas, the raw material gas is supplied to the substrate while the substrate is rotated.

7. The film forming method of claim 1, wherein in the adsorbing of the raw material gas, the raw material gas is supplied in a direction parallel to a surface of the substrate.

8. A film forming system comprising:
   a raw material gas supply unit configured to store a silicon-containing gas serving as a raw material gas in a reservoir, and supply the raw material gas stored in the reservoir to a substrate accommodated in a processing container;
   a reactive gas supply unit configured to supply a nitrogen-containing gas serving as a reactive gas to the substrate; and
   a controller configured to control the raw material gas supply unit and the reactive gas supply unit in order to store the silicon-containing gas in the reservoir, supply the silicon-containing gas stored in the reservoir to the substrate such that the silicon-containing gas is adsorbed on the substrate, and supply the nitrogen-containing gas to the substrate on which the silicon-containing gas is adsorbed in order to generate a silicon nitride product generated by a reaction between the silicon-containing gas and the nitrogen-containing gas,
   wherein the controller is further configured to repeat a process of storing of the silicon-containing gas in the reservoir, a process of supplying of the silicon-containing gas, and a process of supplying of the nitrogen-containing gas a plurality of times, while changing a storage condition for the storing of the silicon-containing gas at least once during a process of repeating, under which the silicon-containing gas is stored in the reservoir,
   the process of storing of the silicon-containing gas includes a first storage process of the storing the silicon-containing gas and a second storage process of the storing the silicon-containing gas each having a different period of time during which the raw material gas is stored in the reservoir, and the first storage process and the second storage process are alternately repeated whenever the process of storing of the silicon-containing gas, the process of supplying of the silicon-containing gas, and the process of supplying of the nitrogen-containing gas are repeated.

9. The film forming method of claim 1, wherein a second period of time during which the silicon-containing gas is stored in the reservoir in the second storage step is longer than a first period of time during which the silicon-containing gas is stored in the reservoir in the first storage step.

10. The film forming method of claim 1, wherein the silicon-containing gas includes at least one of dichlorosilane (DCS), hexachlorodisilane (HCD), monosilane ($SiH_4$), disilane ($Si_2H_6$), hexamethyldisilazane (HMDS), tetrachlorosilane (TCS), disilylamine (DSA), trisilylamine (TSA), bis(tertiary-butylamino)silane (BTBAS), bisdiethylaminosilane (BDEAS), diisopropylaminosilane (DIPAS), and trisdimethylaminosilane (3DMAS).

11. The film forming method of claim 1, wherein the nitrogen-containing gas includes at least one of ammonia ($NH_3$), dinitrogen monoxide ($N_2O$), and nitrogen monoxide (NO).

* * * * *